(12) United States Patent
Lee

(10) Patent No.: US 7,551,499 B2
(45) Date of Patent: Jun. 23, 2009

(54) SEMICONDUCTOR MEMORY DEVICE CAPABLE OF PERFORMING LOW-FREQUENCY TEST OPERATION AND METHOD FOR TESTING THE SAME

(75) Inventor: Hyong-yong Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 42 days.

(21) Appl. No.: 11/803,454

(22) Filed: May 15, 2007

(65) Prior Publication Data

US 2008/0031055 A1 Feb. 7, 2008

(30) Foreign Application Priority Data

Jul. 14, 2006 (KR) ...................... 10-2006-0066195

(51) Int. Cl.
*G11C 29/04* (2006.01)
(52) U.S. Cl. ............. 365/201; 365/189.15; 365/189.16; 365/189.17; 365/194; 365/189.05
(58) Field of Classification Search ................ 365/201, 365/189.15, 189.16, 189.17, 194, 189.05
See application file for complete search history.

(56) References Cited

U.S. PATENT DOCUMENTS

| 5,231,313 | A * | 7/1993 | Itoh ............................ 327/299 |
| 6,055,209 | A | 4/2000 | Abo |
| 6,058,056 | A * | 5/2000 | Beffa et al. .................. 365/201 |
| 6,061,285 | A * | 5/2000 | Tsukikawa ................... 365/201 |
| 6,067,255 | A * | 5/2000 | Jung et al. ............. 365/189.02 |
| 6,239,631 | B1 * | 5/2001 | Fujioka et al. ............... 327/144 |
| 6,404,663 | B2 * | 6/2002 | Shinozaki ...................... 365/63 |
| 6,425,046 | B1 * | 7/2002 | Leung et al. ................. 711/101 |
| 6,463,006 | B2 | 10/2002 | Nakano et al. |
| 6,489,819 | B1 * | 12/2002 | Kono et al. ................... 327/141 |
| 2001/0007136 | A1 * | 7/2001 | Tamura et al. ............... 713/500 |
| 2002/0114210 | A1 * | 8/2002 | Uchida et al. ................ 365/233 |
| 2003/0142566 | A1 * | 7/2003 | Sohn et al. .................... 365/201 |
| 2005/0102590 | A1 * | 5/2005 | Norris et al. ................. 714/719 |
| 2005/0111266 | A1 * | 5/2005 | Rover ..................... 365/189.05 |
| 2005/0172194 | A1 | 8/2005 | Dreibelbis et al. |
| 2006/0239087 | A1 * | 10/2006 | Shin ........................... 365/194 |

FOREIGN PATENT DOCUMENTS

JP 11-025695 1/1999

* cited by examiner

*Primary Examiner*—Hoai V Ho
*Assistant Examiner*—Jay Radke
(74) *Attorney, Agent, or Firm*—Mills & Onello, LLP

(57) ABSTRACT

A semiconductor memory device and a method for testing the same are capable of performing a low-frequency test operation even when a high-frequency external clock signal is input. The method for testing the semiconductor memory device comprises: interpreting a control command from a plurality of external control signals and generating a low-frequency operation control signal when an MRS command included in the control command designates a write and read test operation; when a write command is input as the control command, converting the write command into a low-frequency write command in response to the low-frequency operation control signal, generating an internal low-frequency clock signal in response to the low-frequency operation control signal, and performing a low-frequency write operation based on the internal low-frequency clock signal; and buffering an external clock signal to generate an internal normal-frequency clock signal and, when a read command is input as the control command, performing a read operation based on the internal normal-frequency clock signal in response to the read command.

19 Claims, 6 Drawing Sheets

SEMICONDUCTOR MEMORY DEVICE CAPABLE OF PERFORMING LOW-FREQUENCY TEST OPERATION AND METHOD FOR TESTING THE SAME

CROSS-REFERENCE TO RELATED PATENT APPLICATION

This application claims priority to Korean Patent Application No. 10-2006-0066195, filed on Jul. 14, 2006, in the Korean Intellectual Property Office, the disclosure of which is incorporated herein in its entirety by reference.

BACKGROUND OF THE INVENTION

1. Field of the Invention

The present invention relates to a semiconductor memory device capable of performing a low-frequency test operation and a method for testing the same, and more particularly, to a semiconductor memory device capable of performing a low-frequency test operation even when a high-frequency external clock signal is input and a method for testing the same.

2. Description of the Related Art

With the popularity of consumer electronics, the operating speed of semiconductor memory devices continues to increase. A synchronous semiconductor memory device operates in synchronization with an external clock signal input from an external device. As the frequency of the external clock signal increases, the operating speed of the synchronous semiconductor memory device also increases.

A test apparatus provides a plurality of external control signals and an external clock signal to a synchronous semiconductor memory device and inspects test data writing and reading operations of the synchronous semiconductor memory device to determine whether the synchronous semiconductor memory device is operating properly.

FIG. 1 illustrates a test operation of a semiconductor memory device 120. The semiconductor memory device 120 receives a plurality of external control signals C1, C2, C3, . . . and an external clock signal EXCLK from a test apparatus 110 and performs an operation of writing test data D from DQ or an operation of reading test data Q from DQ based on an internal clock signal INCLK generated from the external clock signal EXCLK.

When the semiconductor memory device 120 buffers the external clock signal EXCLK to generate the internal clock signal INCLK, the internal clock signal INCLK has a high frequency when the external clock signal EXCLK has a high frequency and the internal clock signal INCLK has a low frequency when the external clock signal EXCLK has a low frequency. The semiconductor memory device 120 can, in some cases, double a low-frequency external clock signal EXCLK to generate a high-frequency internal clock signal INCLK. An inexpensive test apparatus can provide the low-frequency external clock signal EXCLK while an expensive test apparatus can provide the high-frequency external clock signal EXCLK.

As the operating speed of the semiconductor memory device 120 increases, the operation speed of the test apparatus 110 is more significant in testing of the performance of a high-frequency operation of the semiconductor memory device 120. There is no problem if defects of the semiconductor memory device 120 can be all detected by the test of the high-frequency operation of the semiconductor memory device 120. However, some defects of the semiconductor memory device 120 are manifested only in a low-frequency operation environment; thus, a performance test of the high-frequency operation of the device cannot detect this particular defect. If the high-frequency operation of the semiconductor memory device 120 is tested using a first test apparatus providing a high-frequency external clock signal and the low-frequency operation of the semiconductor memory device 120 is tested using a second test apparatus providing a low-frequency external clock signal, the cost of performing the test will be considerably increased.

SUMMARY OF THE INVENTION

Accordingly, embodiments of the present invention provide a system and method capable of testing the low-frequency operation as well as the high-frequency operation of semiconductor memory device using a test apparatus that provides only a high-frequency external clock signal. A reduced testing cost is thereby achieved.

Embodiments of the present invention further provide a semiconductor memory device capable of performing a low-frequency test operation even in a case where a high-frequency external clock signal is provided and a method for testing the semiconductor memory device.

According to an aspect of the present invention, there is provided a semiconductor memory device comprising a memory core; a multi-step data input/output circuit that transfers data written to the memory core or that transfers data read from the memory core; a normal-frequency clock unit that receives an external clock signal and outputs an internal normal-frequency clock signal; a command interpreter that receives a plurality of external control signals and generates a control command; a mode register setting (MRS) command processor that outputs a low-frequency operation control signal when an MRS command included in the control command designates a low-frequency test operation; a low-frequency command generator that converts the control command into a low-frequency control command and that outputs the low-frequency control command to the multi-step data input/output circuit; a command path selector that transfers the control command to the multi-step data input/output circuit, or that transmits the control command to the low-frequency command generator in response to the low-frequency operation control signal; and a low-frequency clock unit that generates an internal low-frequency clock signal in response to the low-frequency operation control signal and that provides the internal low-frequency clock signal to the multi-step data input/output circuit.

The multi-step data input/output circuit performs a normal-frequency test operation based on the internal normal-frequency clock signal when receiving the control command from the command path selector and performs the low-frequency test operation based on the internal low-frequency clock signal when receiving the low-frequency control command from the low-frequency command generator.

The normal-frequency clock unit may be a clock buffer that buffers the external clock signal to generate the internal normal-frequency clock signal and provides the internal normal-frequency clock signal to the multi-step data input/output circuit.

The low-frequency clock unit may comprise a frequency divider that frequency-divides the internal normal-frequency clock signals to generate the internal low-frequency clock signal. The low-frequency clock unit may comprise a first delay that delays the low-frequency operation control signal by a predetermined time to control a phase difference between the low-frequency control command and the internal low-frequency clock signal, a buffer that buffers the output signal of the first delay, a second delay that delays the output signal of the buffer, and an NAND gate that performs an NAND operation on the output signal of the buffer and the output signal of the second delay to generate the internal low-frequency clock signal.

The low-frequency command generator may comprise a buffer that buffers the control command, a delay that delays the output signal of the buffer, and an NAND gate that performs an NAND operation on the output signal of the buffer, and the output signal of the delay to generate the low-frequency control command.

The semiconductor memory device may further comprise a high-frequency clock unit that receives the internal normal-frequency clock signal from the normal-frequency clock unit to generate an internal high-frequency clock signal and that provides the internal high-frequency clock signal to the multi-step data input/output circuit. The high-frequency clock unit may comprise a frequency multiplier that multiplies the internal normal-frequency clock signal to generate the internal high-frequency clock signal.

According to another aspect of the present invention, there is provided a method for testing a semiconductor memory device comprising: interpreting a control command from a plurality of external control signals and generating a low-frequency operation control signal when an MRS command included in the control command designates a write and read test operation; when a write command is input as the control command, converting the write command into a low-frequency write command in response to the low-frequency operation control signal, generating an internal low-frequency clock signal in response to the low-frequency operation control signal, and performing a low-frequency write operation based on the internal low-frequency clock signal; and buffering an external clock signal to generate an internal normal-frequency clock signal and, when a read command is input as the control command, performing a read operation based on the internal normal-frequency clock signal in response to the read command.

The write and read test operation performs the low-frequency write operation based on the internal low-frequency clock signal to write data to a memory core of the semiconductor memory device and performs the read operation based on the internal normal-frequency clock signal to read data from the memory core to determine whether the write operation has an error or the read operation has an error.

The internal low-frequency clock signal can be generated by frequency-dividing the internal normal-frequency clock signal.

The internal low-frequency clock signal can be generated by delaying the low-frequency operation control signal by a predetermined time, buffering the delayed signal to generate a buffered signal, and performing an NAND operation on the buffered signal and a signal obtained by delaying the buffered signal.

The low-frequency write command can be generated by performing an NAND operation on a signal obtained by buffering the write command and a signal obtained by delaying the buffered signal.

According to another aspect of the present invention, there is provided a method for testing a semiconductor memory device comprising: receiving an MRS command that designates a write and read test operation and initializing the semiconductor memory device in response to the MRS command; sequentially receiving an active command, a write command and a precharge command, converting the write command into a low-frequency write command in response to the MRS command, and writing data to a memory core of the semiconductor memory device in response to the low-frequency write command; and sequentially receiving the active command, a read command and the precharge command and reading data from the memory core in response to the read command. The writing of the data is performed based on an internal low-frequency clock signal corresponding to the low-frequency write command and the reading of the data is performed based on an internal normal-frequency clock signal generated by buffering an external clock signal.

The write and read test operation performs the low-frequency write operation based on the internal low-frequency clock signal and the read operation based on the internal normal-frequency clock signal to determine whether a write operation of the semiconductor memory device has an error or a read operation of the semiconductor memory device has an error.

The internal low-frequency clock signal can be generated by frequency-dividing the internal normal-frequency clock signal.

The internal low-frequency clock signal can be generated by generating a low-frequency operation control signal in response to the MRS command, delaying the low-frequency operation control signal by a predetermined time and buffering the delayed signal to generate a buffered signal, and performing an NAND operation on the buffered signal and a signal obtained by delaying the buffered signal.

The low-frequency write command can be generated by performing an NAND operation on a signal obtained by buffering the write command and a signal obtained by delaying the buffered signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
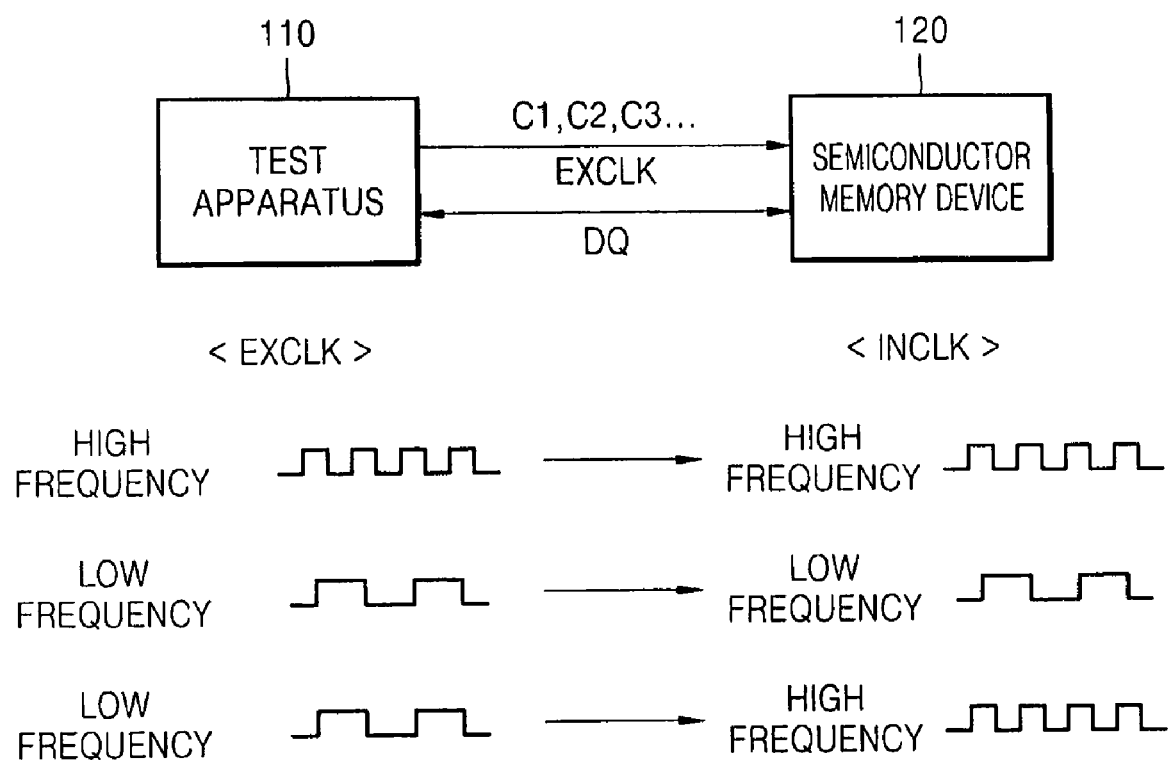
FIG. 1 illustrates a conventional testing operation of a semiconductor memory device.

Embodiments of the present invention will now be described more fully with reference to the accompanying drawings. The invention may, however, be embodied in many different forms and should not be construed as being limited to the embodiments set forth herein; rather, these embodiments are provided so that this disclosure will be thorough and complete. Throughout the drawings, like reference numerals refer to like elements.

Figure 2:
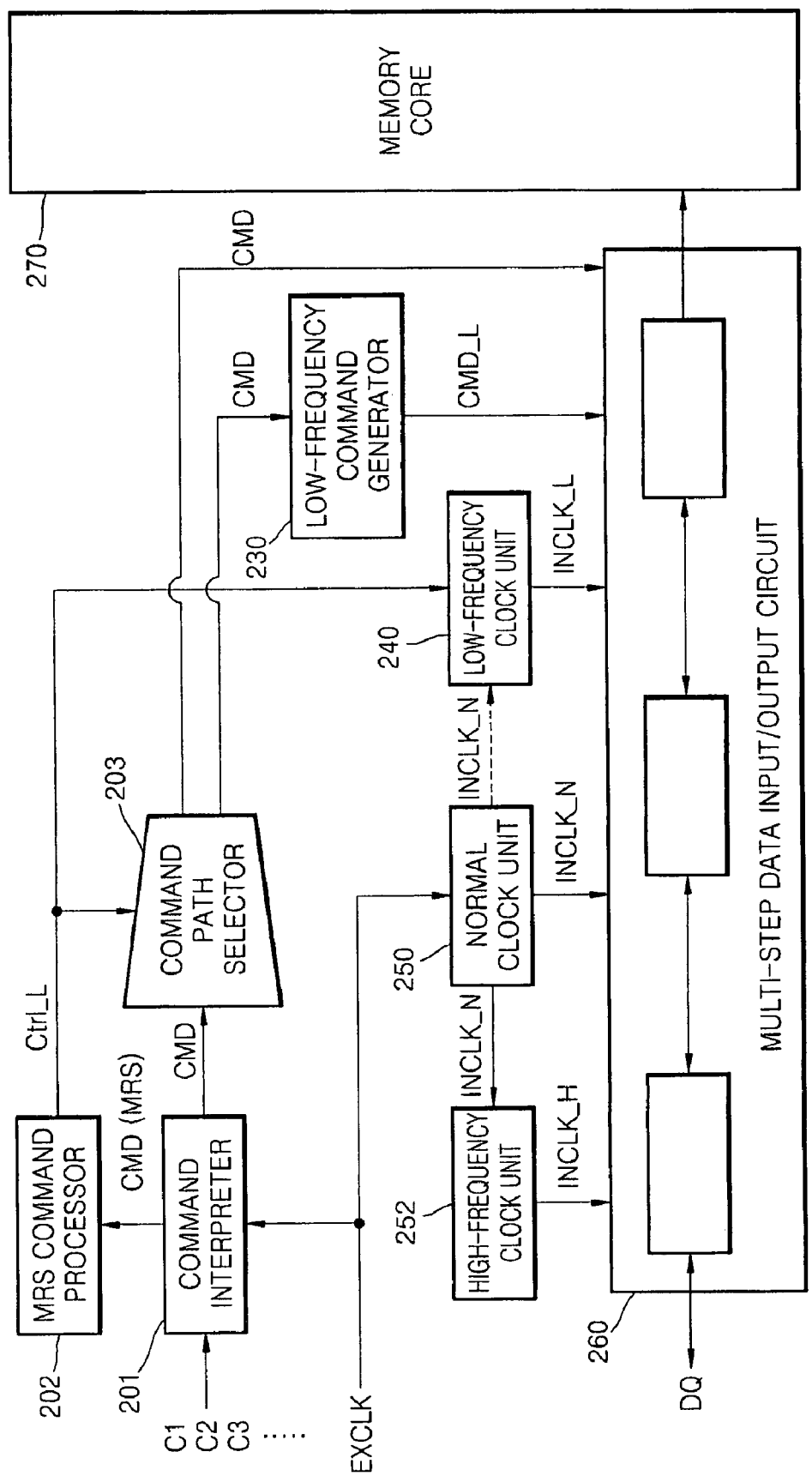
FIG. 2 is a block diagram of a semiconductor memory device according to an embodiment of the present invention.

FIG. 2 is a block diagram of a semiconductor memory device according to an embodiment of the present invention. Referring to FIG. 2, the semiconductor memory device includes a command interpreter 201, a mode register setting (MRS) command processor 202, a command path selector 203, a low-frequency command generator 230, a low-frequency clock unit 240, a normal-frequency clock unit 250, a high-frequency clock unit 252, a multi-step data input/output circuit 260, and a memory core 270.

The normal-frequency clock unit 250 receives an external clock signal EXCLK and outputs an internal normal-frequency clock signal INCLK_N. A clock buffer that buffers the external clock signal EXCLK to generate the internal normal-frequency clock signal INCLK_N and provides the internal normal-frequency clock signal INCLK_N to the multi-step data input/output circuit 260 may be used as the normal-frequency clock unit 250.

The multi-step data input/output circuit 260 transfers data D from DQ written to the memory core 270 or data Q from DQ read from the memory core 270. When the multi-step data input/output circuit 260 receives a control command CMD from the command path selector 203 to perform a normal-frequency test operation, the multi-step data input/output circuit 260 performs a write operation or a read operation based on the internal normal-frequency clock signal INCLK_N received from the normal-frequency clock unit 250.

The command interpreter 201 receives a plurality of external control signals C1, C2, C3, . . . and interprets the control command CMD. For example, the command interpreter 201 receives a chip select signal, a row address strobe signal, a column address strobe signal and a write enable signal and interprets the control command CMD from a combination of the logic levels of these signals.

The MRS command processor 202 sets the operating mode of the semiconductor memory device in response to an MRS command included in the control command CMD. Particularly, the MRS processor 202 according to the present invention outputs a low-frequency operation control signal Ctrl_L when the MRS command included in the control command CMD designates a low-frequency test operation.

The command path selector 203 transmits the control command CMD to the multi-step data input/output circuit 260, or transmits the control command CMD to the low-frequency command generator 230 in response to the low-frequency operation control signal Ctrl_L. The control command CMD is transmitted to the multi-step data input/output circuit 260 when the semiconductor memory device is to perform a normal-frequency test operation. However, the control command CMD is transferred to the low-frequency command generator 230 and converted into a low-frequency control command CMD_L when the semiconductor memory device is to perform a low-frequency test operation.

Figure 4:
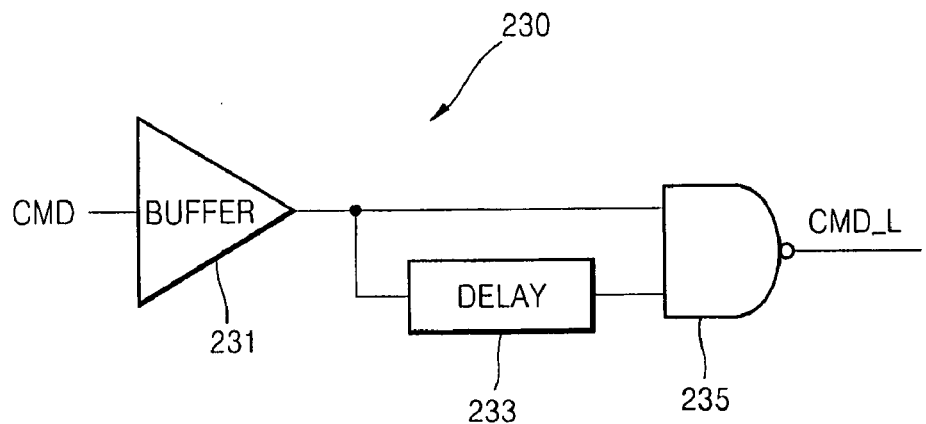
FIG. 4 illustrates a low-frequency command generator illustrated in FIG. 2 according to an embodiment of the present invention.

The low-frequency command generator 230 converts the control command CMD into the low-frequency control command CMD_L. The low-frequency control command CMD_L is input to the multi-step data input/output circuit 260 to control the low-frequency test operation of the semiconductor memory device. FIG. 4 illustrates an embodiment of the low-frequency command generator 230 according to an embodiment of the present invention.

Referring to FIG. 4, the low-frequency command generator 230 includes a buffer 231 buffering the control command CMD, a delay 233 delaying the output signal of the buffer 231, and an NAND gate 235 performing an NAND operation on the output signal of the delay 233 and the output signal of the buffer 231 to generate the low-frequency control command CMD_L. The configuration of the low-frequency command generator 230 is not limited to the configuration illustrated in FIG. 4 and the low-frequency command generator 230 can be constructed in various forms.

Figure 3A:
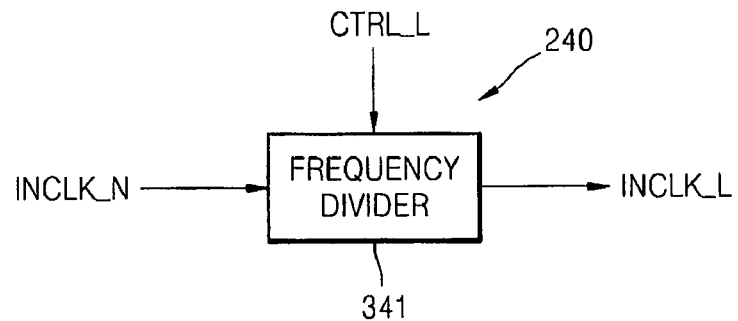
FIG. 3A illustrates a low-frequency clock unit illustrated in FIG. 2 according to an embodiment of the present invention.
Figure 3B:
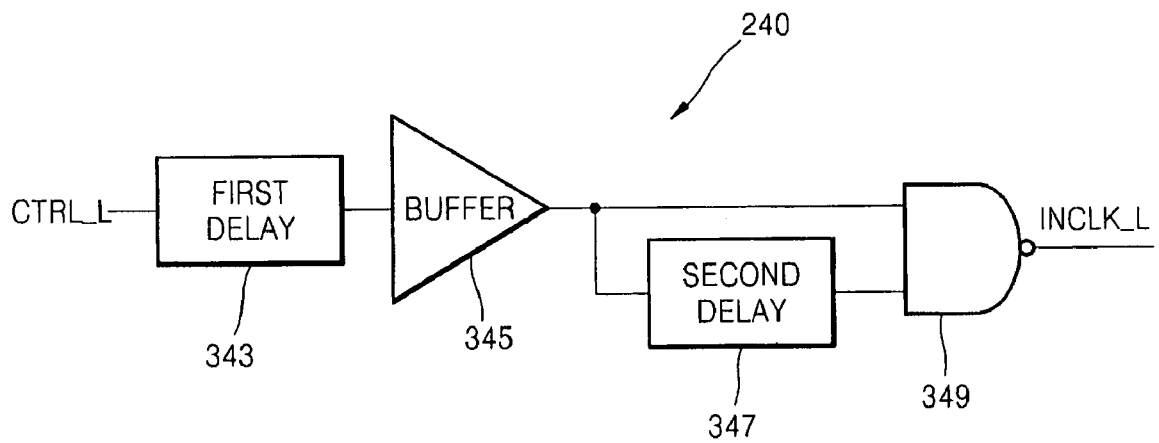
FIG. 3B illustrates the low-frequency clock unit illustrated in FIG. 2 according to another embodiment of the present invention.

Returning to FIG. 2, the low-frequency clock unit 240 generates an internal low-frequency clock signal INCLK_L in response to the low-frequency operation control signal Ctrl_L and provides the internal low-frequency clock signal INCLK_L to the multi-step data input/output circuit 260. FIGS. 3A and 3B illustrate the low-frequency clock unit 240 according to first and second embodiments. The low-frequency clock unit 240 is not limited to the examples illustrated in FIGS. 3A and 3B and it can be constructed in various forms.

Referring to FIG. 3A, the first illustrated embodiment of the low-frequency clock unit 240 is configured in the form of a frequency divider 341 that frequency-divides the internal normal-frequency clock signal INCLK_N to generate the internal low-frequency clock signal INCLK_L. Referring to FIG. 3B, the second illustrated embodiment of the low-frequency clock unit 240 may include a first delay 343 delaying the low-frequency operation control signal Ctrl_L by a predetermined time to control a phase difference between the low-frequency control command CMD_L and the internal low-frequency clock signal INCLK_L, a buffer 345 buffering the output signal of the first delay 343, a second delay 347 delaying the output signal of the buffer 345, and an NAND gate 349 performing an NAND operation on the output signal of the buffer 345 and the output signal of the second delay 347 to generate the internal low-frequency clock signal INCLK_L.

Referring back to FIG. 2, the multi-step data input/output circuit 260 performs the normal-frequency test operation based on the internal normal-frequency clock signal INCLK_N when receiving the control command CMD from the command path selector 203 and performs the low-frequency test operation based on the internal low-frequency clock signal INCLK_L when receiving the low-frequency control command CMD_L from the low-frequency command generator 230. That is, the semiconductor memory device according to the present invention can perform the low-frequency test operation based on the internal low-frequency clock signal INCLK_L in addition to the normal-frequency test operation based on the internal normal-frequency clock signal INCLK_N. When the external clock signal EXCLK has a high frequency, particularly, the semiconductor memory device can perform a high-frequency test operation based on the internal normal-frequency clock signal INCLK_N corresponding to the external clock signal EXCLK and can carry out the low-frequency test operation based on the internal low-frequency clock signal INCLK_L in response to the MRS command that designates the low-frequency test operation. Accordingly, the low-frequency operation of the semiconductor memory device can be tested using a test apparatus that provides a high-frequency external clock signal EXCLK.

The semiconductor memory device can further include the high-frequency clock unit 252 that receives the internal normal-frequency clock signal INCLK_N from the normal-frequency clock unit 250 to generate an internal high-frequency clock signal INCLK_H and provides the internal high-frequency clock signal INCLK_H to the multi-step data input/output circuit 260. The high-frequency clock unit 252 may be configured in the form of a frequency multiplier that frequency-multiplies the internal normal-frequency clock signal INCLK_N to generate the internal high-frequency clock signal INCLK_H. When the internal high-frequency clock signal INCLK_H is provided to the multi-step data input/output circuit 260, the semiconductor memory device can perform a high-frequency test operation based on the internal high-frequency clock signal INCLK_H.

When the high-frequency external clock signal EXCLK is applied to the semiconductor memory device, the normal-frequency test operation based on the internal normal-frequency clock signal INCLK_N corresponds to the high-frequency operation and the test operation based on the internal low-frequency clock signal INCLK_L corresponds to the low-frequency operation. When a low-frequency external clock signal EXCLK is provided to the semiconductor memory device, the normal-frequency test operation based on the internal normal-frequency clock signal INCLK_N corresponds to the low-frequency operation and the test operation based on the internal high-frequency clock signal INCLK_H corresponds to the high-frequency operation.

A write and read test operation of the semiconductor memory device according to an embodiment of the present invention will now be explained.

The write and read test operation writes test data to all memory cells of the semiconductor memory device, reads the test data from all the memory cells and determines whether the written test data corresponds to the read test data, in order to test the semiconductor memory device. When the written test data does not correspond to the read test data, it is important to determine whether the mismatch is caused by an error in the write operation or by an error in the read operation.

A case where a low-frequency write operation verified to be error-free is adopted in order to test a high-frequency write and high-frequency read operation will now be explained.

First, test data is written according to a high-frequency write operation and the test data is read according to a high-frequency read operation. When the written test data does not correspond to the read test data, the test data is written by the verified low-frequency write operation and the written test data is read by the high-frequency read operation. When the written test data does not correspond to the read test data even in this case, it can be determined that the high-frequency read operation has an error. When the written test data corresponds to the read test data, it can be determined that the high-frequency write operation has an error.

In the write and read test operations according to the embodiments of the present invention, the test data is written to all memory cells of the semiconductor memory device according to the low-frequency write operation based on the internal low-frequency clock signal INCLK_L and the written test data is read from all the memory cells according to a read operation based on the internal normal-frequency clock signal INCLK_N. Here, when a high-frequency external clock signal EXCLK is applied to the semiconductor memory device, the read operation based on the internal normal-frequency clock signal INCLK_N corresponds to a high-frequency read operation. The write and read test operations will now be explained with reference to FIG. 2.

The control command CMD is interpreted from the plurality of external control signals C1, C2, C3, . . . and the low-frequency operation control signal Ctrl_L is generated when the MRS command included in the control command CMD designates the write and read test operation.

Then, when a write command is input as the control command CMD, the write command is converted into a low-frequency write command in response to the low-frequency operation control signal Ctrl_L, the internal low-frequency clock signal INCLK_L is generated in response to the low-frequency operation control signal Ctrl_L, and a low-frequency write operation is executed based on the internal low-frequency clock signal INCLK_L in response to the low-frequency write command.

The external clock signal EXCLK is also buffered to generate the internal normal-frequency clock signal INCLK_N and, when a read command is input as the control command CMD, a read operation based on the internal normal-frequency clock signal INCLK_N is performed in response to the read command.

The aforementioned write and read test operation performs the low-frequency write operation based on the internal low-frequency clock signal INCLK_L to write data to the memory core 270 of the semiconductor memory device and performs the read operation based on the internal normal-frequency clock signal INCLK_N to read the data from the memory core 270 to determine whether the write operation has an error or the read operation has an error.

The internal low-frequency clock signal INCLK_L may be generated by frequency-dividing the internal normal-frequency clock signal INCLK_N, for example according to the embodiment of FIG. 3A. Otherwise, the internal low-frequency clock signal INCLK_L may be generated by delaying the low-frequency operation control signal Ctrl_L by a predetermined time, buffering the delayed signal, and performing an NAND operation on the buffered signal and a signal obtained by delaying the buffered signal, for example according to the embodiment of FIG. 3B.

The low-frequency write command can be generated by carrying out an NAND operation on a signal obtained by buffering the write command and a signal obtained by delaying the buffered signal, for example according to the embodiment of FIG. 4.

Figure 5A:
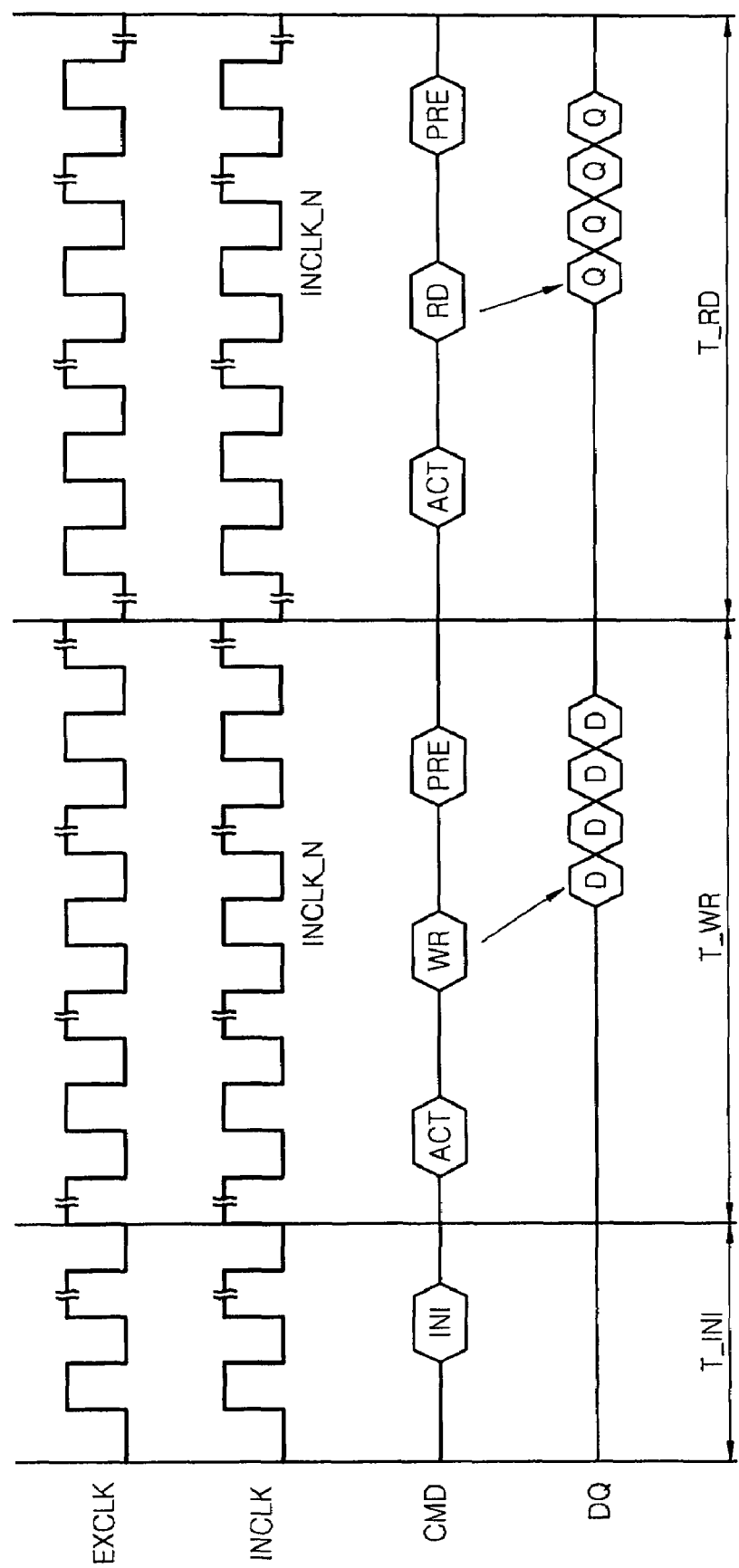
FIGS. 5A, 5B and 5C are timing diagrams of an external clock signal, an internal clock signal, a control command, a low-frequency control command and data.
Figure 5B:
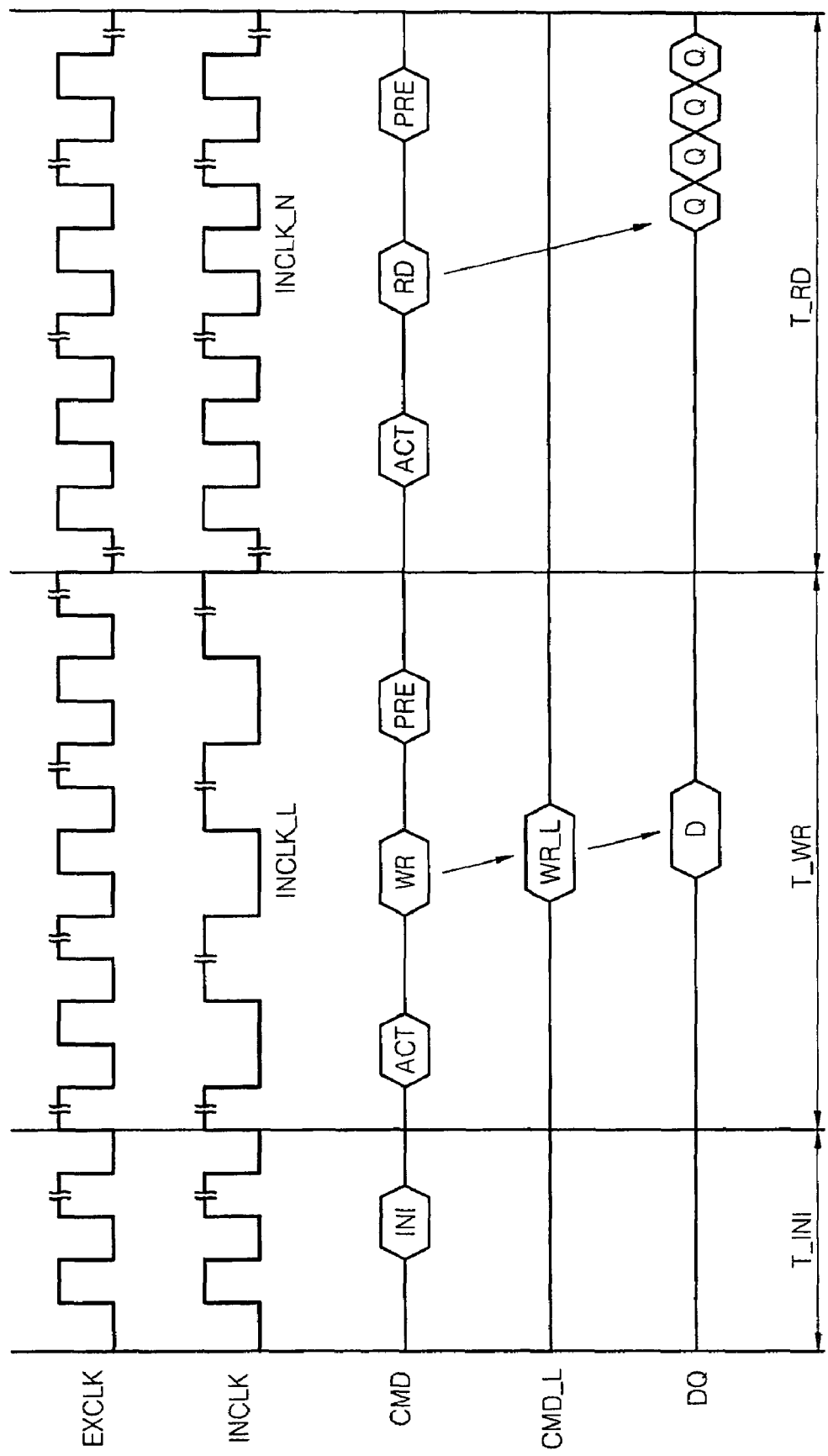
Figure 5C:
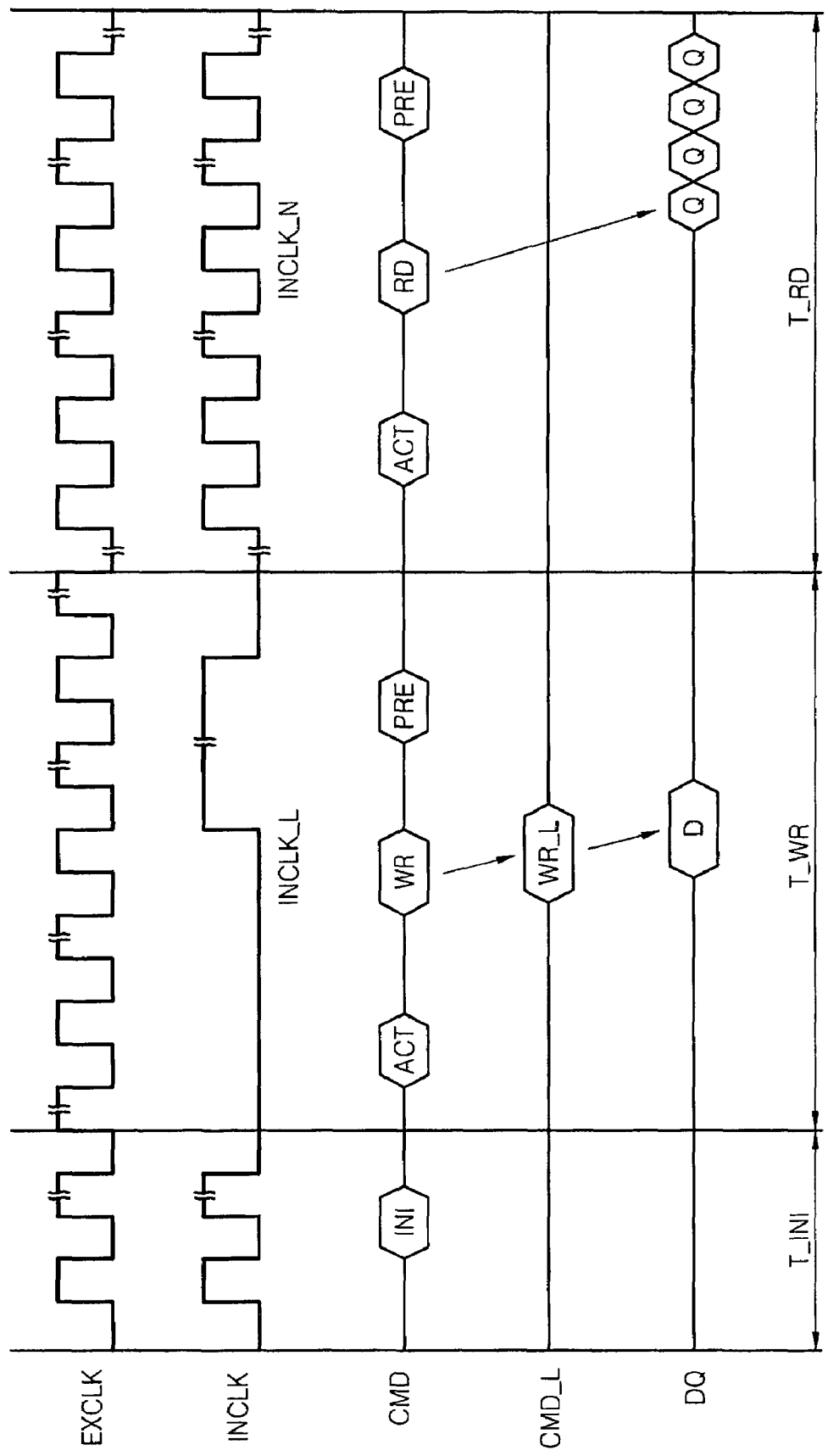

FIGS. 5A, 5B and 5C are timing diagrams of the external clock signal EXCLK, the internal clock signal INCLK, the control command CMD, the low-frequency control command CMD_L and data DQ.

In FIGS. 5A, 5B and 5C, INI denotes an initialization command, ACT represents an active command related to activation of a wordline, PRE denotes a precharge command after a write operation or a read operation, WR represents a write command and RD denotes a read command. In addition, T_INI represents an initialization stage, T_WR denotes a write stage, and T_RD denotes a read stage.

FIG. 5A illustrates a write and read test operation that writes data D by a write operation based on the internal normal-frequency clock signal INCLK_N and reads data Q by a read operation based on the internal normal-frequency clock signal INCLK_N. When the external clock signal EXCLK has a high frequency, the write operation based on the internal normal-frequency clock signal INCLK_N corresponds to a high-frequency write operation and the read operation based on the internal normal-frequency clock signal INCLK_N corresponds to a high-frequency read operation. FIG. 5A illustrates a case where a burst length (the number of bits written by a one-time write operation or the number of bits read by a one-time read operation) is 4 as an example of the high-frequency write operation and the high-frequency read operation.

FIGS. 5B and 5C illustrate a write and read test operation that writes the data D by a write operation based on the internal low-frequency clock signal INCLK_L and reads the data Q by a read operation based on the internal normal-frequency clock signal INCLK_N. When the external clock signal EXCLK has a high frequency, the write operation based on the internal low-frequency clock signal INCLK_L corresponds to a low-frequency write operation and the read operation based on the internal normal-frequency clock signal INCLK_N corresponds to a high-frequency read operation. FIGS. 5B and 5C respectively illustrate a low-frequency write operation having a burst length of 1 and a high-frequency read operation having a burst length of 4.

Specifically, in the initialization stage T_IN, the MRS command INI designating the write and read test operation is input and the semiconductor memory device is initialized in response to the MRS command INI.

In the write stage T_WR, the active command ACT, the write command WR and the precharge command PRE are sequentially input to the semiconductor memory device, the write command WR is converted into the low-frequency write command WR_L in response to the MRS command INI, and the data D is written to the memory core (270 illustrated in FIG. 2) of the semiconductor memory device in response to the low-frequency write command WR_L.

In the read stage T_RD, the active command ACT, the read command RD and the precharge command PRE are sequentially input to the semiconductor memory device and the data Q is read from the memory core 270 in response to the read command RD.

As illustrated in FIGS. 5B and 5C, the write stage T_WR is performed based on the internal low-frequency clock signal INCLK_L corresponding to the low-frequency write command WR_L and the read stage T_RD is performed based on the internal normal-frequency clock signal INCLK_N generated by buffering the external clock signal EXCLK. The aforementioned write and read test operation executes the low-frequency write operation based on the internal low-frequency clock signal INCLK_N and the read operation based on the internal normal-frequency clock signal INCLK_N to test whether the write operation has an error or the read operation has an error.

As described above, the internal low-frequency clock signal INCLK_L may be generated by frequency-dividing the internal normal-frequency clock signal INCLK_N, as illustrated in the example embodiment described in connection with FIG. 3A and FIG. 5B. Otherwise, the internal low-frequency clock signal INCLK_L may be generated by generating the low-frequency operation control signal Ctrl_L in response to the MRS command, delaying the low-frequency operation control signal Ctrl_L by a predetermined time, buffering the delayed signal, and performing an NAND operation on the buffered signal and a signal obtained by delaying the buffered signal, as illustrated in the example embodiment described in connection with FIG. 3B and FIG. 5C.

The low-frequency write command WR_L may be generated by carrying out an NAND operation on a signal obtained by buffering the write command WR and a signal obtained by delaying the buffered write command WR, as illustrated in the example embodiment described in connection with FIG. 4.

According to the present invention, a low-frequency operation of a semiconductor memory device can be tested even when a high-frequency external clock signal is input to the semiconductor memory device. Accordingly, the test range of the device and system can be extended, and the cost of testing can be reduced.

While embodiments of the present invention has been particularly shown and described with reference to example embodiments thereof, it will be understood by those of ordinary skill in the art that various changes in form and details may be made herein without departing from the spirit and scope of the present invention as defined by the following claims.

What is claimed is:

1. A semiconductor memory device comprising:
a memory core;
a multi-step data input/output circuit that transfers data written to the memory core through one data path or that transfers data read from the memory core through the one data path;
a normal-frequency clock unit that receives an external clock signal and outputs an internal normal-frequency clock signal;
a command interpreter that receives a plurality of external control signals and generates a control command;
an MRS command processor that outputs a low-frequency operation control signal when an MRS command included in the control command designates a low-frequency test operation;
a low-frequency command generator that converts the control command into a low-frequency control command and that outputs the low-frequency control command to the multi-step data input/output circuit;
a command path selector that transfers the control command to the multi-step data input/output circuit, or that transmits the control command to the low-frequency command generator in response to the low-frequency operation control signal; and
a low-frequency clock unit that generates an internal low-frequency clock signal in response to the low-frequency operation control signal and that provides the internal low-frequency clock signal to the multi-step data input/output circuit,
wherein the low-frequency clock unit controls a phase of the internal low-frequency clock signal to synchronize the internal low-frequency clock signal with the low-frequency control command, and
wherein the one data path receives the data, the control command and the internal normal-frequency clock signal when a normal-frequency operation is performed, and the one data path receives the data, the low-frequency control command and the internal low-frequency clock signal when the low-frequency test operation is performed.

2. The semiconductor memory device of claim 1, wherein the multi-step data input/output circuit performs a normal-frequency test operation based on the internal normal-frequency clock signal when receiving the control command from the command path selector and performs the low-frequency test operation based on the internal low-frequency clock signal when receiving the low-frequency control command from the low-frequency command generator.

3. The semiconductor memory device of claim 2, wherein the normal-frequency clock unit comprises a clock buffer that buffers the external clock signal to generate the internal normal-frequency clock signal and provides the internal normal-frequency clock signal to the multi-step data input/output circuit.

4. The semiconductor memory device of claim 2, wherein the low-frequency clock unit includes a frequency divider that frequency-divides the internal normal-frequency clock signal to generate the internal low-frequency clock signal.

5. The semiconductor memory device of claim 2, wherein the low-frequency clock unit comprises:
a first delay that delays the low-frequency operation control signal by a predetermined time to control a phase difference between the low-frequency control command and the internal low-frequency clock signal;

a buffer that buffers the output signal of the first delay;
a second delay that delays the output signal of the buffer; and
an NAND gate that performs an NAND operation on the output signal of the buffer and the output signal of the second delay to generate the internal low-frequency clock signal.

6. The semiconductor memory device of claim 2, wherein the low-frequency command generator comprises:
a buffer that buffers the control command;
a delay that delays the output signal of the buffer; and
an NAND gate that performs an NAND operation on the output signal of the buffer and the output signal of the delay to generate the low-frequency control command.

7. The semiconductor memory device of claim 1, further comprising a high-frequency clock unit that receives the internal normal-frequency clock signal from the normal-frequency clock unit to generate an internal high-frequency clock signal and provides the internal high-frequency clock signal to the multi-step data input/output circuit.

8. The semiconductor memory device of claim 7, wherein the high-frequency clock unit includes a frequency multiplier that frequency-multiplies the internal normal-frequency clock signal to generate the internal high-frequency clock signal.

9. The semiconductor memory device of claim 7, wherein the multi-step data input/output circuit performs a high-frequency test operation based on the internal high-frequency clock signal.

10. A method for testing a semiconductor memory device comprising:
interpreting a control command from a plurality of external control signals and generating a low-frequency operation control signal when an MRS command included in the control command designates a write and read test operation;
when a write command is input as the control command, converting the write command into a low-frequency write command in response to the low-frequency operation control signal, generating an internal low-frequency clock signal synchronized with the low-frequency write command in response to the low-frequency operation control signal, and performing a low-frequency write operation through one data path receiving the read command and the internal low-frequency clock signal; and
buffering an external clock signal to generate an internal normal-frequency clock signal and, when a read command is input as the control command, performing a read operation through the one data path receiving the read command and the internal normal-frequency clock signal.

11. The method of claim 10, wherein the write and read test operation performs the low-frequency write operation based on the internal low-frequency clock signal to write data to a memory core of the semiconductor memory device and performs the read operation based on the internal normal-frequency clock signal to read data from the memory core to determine whether the write operation has an error or the read operation has an error.

12. The method of claim 10, wherein the internal low-frequency clock signal is generated by frequency-dividing the internal normal-frequency clock signal.

13. The method of claim 10, wherein the internal low-frequency clock signal is generated by delaying the low-frequency operation control signal by a predetermined time, buffering the delayed signal to generate a buffered signal, and performing an NAND operation on the buffered signal and a signal obtained by delaying the buffered signal.

14. The method of claim 10, wherein the low-frequency write command is generated by performing an NAND operation on a signal obtained by buffering the write command and a signal obtained by delaying the buffered signal.

15. A method for testing a semiconductor memory device comprising:
receiving an MRS command that designates a write and read test operation and initializing the semiconductor memory device in response to the MRS command;
sequentially receiving an active command, a write command and a precharge command, converting the write command into a low-frequency write command in response to the MRS command, and writing data to a memory core of the semiconductor memory device in response to the low-frequency write command; and
sequentially receiving an active command, a read command and a precharge command and reading data from the memory core in response to the read command,
wherein the writing of the data is performed through one data path receiving the low-frequency write command and an internal low-frequency clock signal synchronized with the low-frequency write command and the reading of the data is performed through the one data path receiving the read command and an internal normal-frequency clock signal generated by buffering an external clock signal.

16. The method of claim 15, wherein the write and read test operation performs the low-frequency write operation based on the internal low-frequency clock signal and the read operation based on the internal normal-frequency clock signal to determine whether a write operation of the semiconductor memory device has an error or a read operation of the semiconductor memory device has an error.

17. The method of claim 15, wherein the internal low-frequency clock signal is generated by frequency-dividing the internal normal-frequency clock signal.

18. The method of claim 15, wherein the internal low-frequency clock signal is generated by generating a low-frequency operation control signal in response to the MRS command, delaying the low-frequency operation control signal by a predetermined time and buffering the delayed signal to generate a buffered signal, and performing an NAND operation on the buffered signal and a signal obtained by delaying the buffered signal.

19. The method of claim 15, wherein the low-frequency write command is generated by performing an NAND operation on a signal obtained by buffering the write command and a signal obtained by delaying the buffered signal.

* * * * *